(12) United States Patent
Sloey et al.

(10) Patent No.: US 10,696,078 B2
(45) Date of Patent: Jun. 30, 2020

(54) SPACE-EFFICIENT FLEX CABLE WITH IMPROVED SIGNAL INTEGRITY FOR A PORTABLE ELECTRONIC DEVICE

(71) Applicant: Apple Inc., Cupertino, CA (US)

(72) Inventors: Jason Sloey, San Jose, CA (US); Simon C. Helmore, San Francisco, CA (US); James B. Smith, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/127,071

(22) Filed: Sep. 10, 2018

(65) Prior Publication Data

US 2019/0082529 A1 Mar. 14, 2019

Related U.S. Application Data

(60) Provisional application No. 62/557,090, filed on Sep. 11, 2017.

(51) Int. Cl.
*H05K 7/00* (2006.01)
*B41M 5/24* (2006.01)
(Continued)

(52) U.S. Cl.
CPC ............ *B41M 5/24* (2013.01); *F28F 21/084* (2013.01); *F28F 21/085* (2013.01); *G06F 1/1626* (2013.01); *G06F 1/1656* (2013.01); *H01P 3/08* (2013.01); *H04M 1/0202* (2013.01); *H05K 1/0216* (2013.01); *H05K 1/181* (2013.01); *H05K 5/0004* (2013.01); *H05K 5/0017* (2013.01); *H05K 5/0086* (2013.01);
(Continued)

(58) Field of Classification Search
USPC ....................................................... 361/760
See application file for complete search history.

(56) References Cited

U.S. PATENT DOCUMENTS 5,872,545 A * 2/1999 Rammos ............ H01Q 21/0075
343/700 MS
5,991,155 A 11/1999 Kobayashi et al.
(Continued)

FOREIGN PATENT DOCUMENTS

WO 2005048298 A2 5/2005

OTHER PUBLICATIONS

"Gorilla University: Quantum Induction Wireless Charging", Quantum Induction Technology—Gorilla Gadgets; https://gorillagadgets.com/blogs/gorilla-gadgets-blog/qi-quantum-induction-wireless-charging; Aug. 3, 2017, 9 pages.
(Continued)

*Primary Examiner* — Andargie M Aychillhum
(74) *Attorney, Agent, or Firm* — Dickinson Wright RLLP

(57) ABSTRACT

This application relates to a flexible cable for a portable electronic device, where the portable electronic device includes operational components having connectors that are capable of being electrically coupled to the flexible cable. The flexible cable includes a dielectric substrate having a generally planar shape, an upper grounding plane, a lower grounding plane, and a first signal transmission line that is separated by the upper and lower grounding planes, where the dielectric substrate is capable of electromagnetically shielding the first signal transmission line.

20 Claims, 10 Drawing Sheets

(51) Int. Cl.

| | | |
|---|---|---|
| *G06F 1/16* | (2006.01) | |
| *H04M 1/02* | (2006.01) | |
| *H01P 3/08* | (2006.01) | |
| *H05K 1/02* | (2006.01) | |
| *H05K 1/18* | (2006.01) | |
| *H05K 5/00* | (2006.01) | |
| *H05K 5/02* | (2006.01) | |
| *H05K 5/03* | (2006.01) | |
| *H05K 5/06* | (2006.01) | |
| *H05K 9/00* | (2006.01) | |
| *F28F 21/08* | (2006.01) | |
| *H05K 7/20* | (2006.01) | |
| *H01R 12/79* | (2011.01) | |
| *H05K 1/14* | (2006.01) | |
| *H02J 50/10* | (2016.01) | |
| *H02J 7/02* | (2016.01) | |

(52) U.S. Cl.
CPC .............. *H05K 5/0217* (2013.01); *H05K 5/03* (2013.01); *H05K 5/069* (2013.01); *H05K 7/2039* (2013.01); *H05K 9/0007* (2013.01); *H05K 9/0075* (2013.01); *H01R 12/79* (2013.01); *H02J 7/025* (2013.01); *H02J 50/10* (2016.02); *H04M 1/026* (2013.01); *H04M 1/0264* (2013.01); *H04M 1/0283* (2013.01); *H05K 1/147* (2013.01); *H05K 2201/10189* (2013.01)

(56) References Cited

U.S. PATENT DOCUMENTS

| | | | |
|---|---|---|---|
| 7,119,419 | B2 | 10/2006 | Kato et al. |
| 7,292,441 | B2 | 11/2007 | Smalc et al. |
| 7,583,834 | B2 | 9/2009 | McCollough et al. |
| 7,652,729 | B2 | 1/2010 | Minaguchi et al. |
| 7,760,289 | B2 | 7/2010 | Nakanishi et al. |
| 8,110,744 | B2 | 2/2012 | Wong et al. |
| 8,281,483 | B2 | 10/2012 | Hofmann et al. |
| 8,669,483 | B2 | 3/2014 | Shimura et al. |
| 8,740,634 | B2 | 6/2014 | Uesaka et al. |
| 8,762,749 | B2 | 6/2014 | Azancot et al. |
| 8,960,818 | B2 | 2/2015 | Myers et al. |
| 9,143,586 | B2 | 9/2015 | Kllore et al. |
| 9,380,714 | B2 | 6/2016 | Shin et al. |
| 9,469,469 | B2 | 10/2016 | Rayner |
| 9,583,256 | B2 | 2/2017 | Lapetina et al. |
| 9,601,286 | B2 | 3/2017 | Lynch et al. |
| 9,769,929 | B1 * | 9/2017 | Stanley ................. H05K 1/189 |
| 9,973,013 | B2 | 5/2018 | Yan |
| 10,003,371 | B1 | 6/2018 | Given et al. |
| 10,218,830 | B1 | 2/2019 | Liu et al. |
| 2003/0066672 | A1 | 4/2003 | Watchko et al. |
| 2007/0262836 | A1 * | 11/2007 | Voss ........................ H01P 3/081 333/247 |
| 2008/0151503 | A1 | 6/2008 | Aapro et al. |
| 2008/0164840 | A1 | 7/2008 | Kato et al. |
| 2010/0072952 | A1 | 3/2010 | Nakajima |
| 2012/0234524 | A1 | 9/2012 | Fan et al. |
| 2013/0033581 | A1 | 2/2013 | Woo et al. |
| 2014/0177197 | A1 | 6/2014 | Lampinen |
| 2014/0192467 | A1 | 7/2014 | Kwong |
| 2014/0367369 | A1 | 12/2014 | Nashner et al. |
| 2015/0111623 | A1 | 4/2015 | Hegemier et al. |
| 2015/0198864 | A1 | 7/2015 | Havskjold et al. |
| 2017/0085764 | A1 | 3/2017 | Kim et al. |
| 2018/0053981 | A1 | 2/2018 | Bae et al. |
| 2018/0084680 | A1 | 3/2018 | Jarvis et al. |
| 2018/0190408 | A1 | 7/2018 | Chin |
| 2019/0041909 | A1 | 2/2019 | Pakula et al. |
| 2019/0082083 | A1 | 3/2019 | Jarvis et al. |

OTHER PUBLICATIONS

"Magnetic shielding materials to protect sensitive electronics", Electronic Products, https://www.electronicproducts.com/Packaging_and_Hardware/Shielding_and_Insulation/Magnetic_shielding_materials_to_protect_sensitive_electronics.aspx, posted on Sep. 22, 2014, 3 pages.

* cited by examiner

SPACE-EFFICIENT FLEX CABLE WITH IMPROVED SIGNAL INTEGRITY FOR A PORTABLE ELECTRONIC DEVICE

CROSS-REFERENCE TO RELATED APPLICATIONS

The present application claims the benefit of U.S. Provisional Application No. 62/557,090, entitled "PORTABLE ELECTRONIC DEVICE," filed Sep. 11, 2017, which is incorporated by reference herein in its entirety for all purposes.

This patent application is also related and incorporates by reference in their entirety each of the following co-pending patent applications:
(i) U.S. patent application Ser. No. 16/127,043 entitled "THERMALLY CONDUCTIVE STRUCTURE FOR DISSIPATING HEAT IN A PORTABLE ELECTRONIC DEVICE" by HOOTON et al. filed Sep. 10, 2018;
(ii) U.S. patent application Ser. No. 16/127,055 entitled "PLATE FOR MAGNETIC SHIELDING OF AN OPERATIONAL COMPONENT IN A PORTABLE ELECTRONIC DEVICE" by WAH et al. filed Sep. 10, 2018;
(iii) U.S. patent application Ser. No. 16/127,064 entitled "STRUCTURES FOR SECURING OPERATIONAL COMPONENTS IN A PORTABLE ELECTRONIC DEVICE" by RAMMAH et al. filed Sep. 10, 2018; and
(iv) U.S. patent application Ser. No. 16/126,984 entitled "SUBSTRATE MARKING FOR SEALING SURFACES" by HAWTHORNE et al. filed Sep. 10, 2018.

FIELD

The described embodiments relate generally to a flexible cable for electrically connecting operational components of a portable electronic device. More particularly, the described embodiments relate to a single flexible cable that incorporates multiple data signal transmission lines.

BACKGROUND

Recent consumer demand has led manufacturers to incorporate additional operational components (e.g., processors, antennas, front cameras, rear cameras, haptic feedback components, etc.) into portable electronic devices. However, these portable electronic devices are generally characterized as having enclosures with small cavities. Therefore, the amount of available space within these small cavities to incorporate these additional operational components is severely limited. Further exacerbating the limited amount of available space is that each of these additional operational components requires a cable to transmit/receive data signals with one or more processors. Accordingly, there is a need for more space-efficient solutions for incorporating these operational components into portable electronic devices.

SUMMARY

This paper describes various embodiments that relate to a flexible cable for electrically connecting operational components of a portable electronic device. In particular, the various embodiments relate to a single flexible cable that incorporates multiple data signal transmission lines.

According to some embodiments, a cable for a portable electronic device, where the portable electronic device includes operational components having connectors that are capable of being electrically coupled to the cable, is described. The cable includes a dielectric substrate that encloses grounding planes, a first signal transmission line that is overlaid by one of the grounding planes, and a second signal transmission line, where the first and second signal transmission lines are disposed between the grounding planes, and the dielectric substrate is capable of electromagnetically shielding the first and second signal transmission lines.

According to some embodiments, a portable electronic device is described. The portable electronic device includes operational components that are separated by a pathway, where the operational components include connectors, and a cable that traverses a length of the pathway, the cable being electrically coupled to the connectors. The cable includes grounding planes, and first and second signal transmission lines that are overlaid by the grounding planes, where the cable includes (i) a first section having a first set of dimensions that correspond to a first region of the cable pathway, and (ii) a second section having a second set of dimensions that are different than the first set of dimensions, where the second set of dimensions correspond to a second region of the cable pathway.

According to some embodiments, a portable electronic device is described. The portable electronic device includes a cable having (i) a first signal transmission line, and (ii) a second signal transmission line, where the first and second signal transmission lines are separated by grounding planes, a circuit board that is electrically coupled to an operational component, and a connector that electrically couples the cable to the circuit board, the connector including at least one row of pins that is electrically coupled to the first and second signal transmission lines.

Other aspects and advantages of the invention will become apparent from the following detailed description taken in conjunction with the accompanying drawings which illustrate, by way of example, the principles of the described embodiments.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1A:
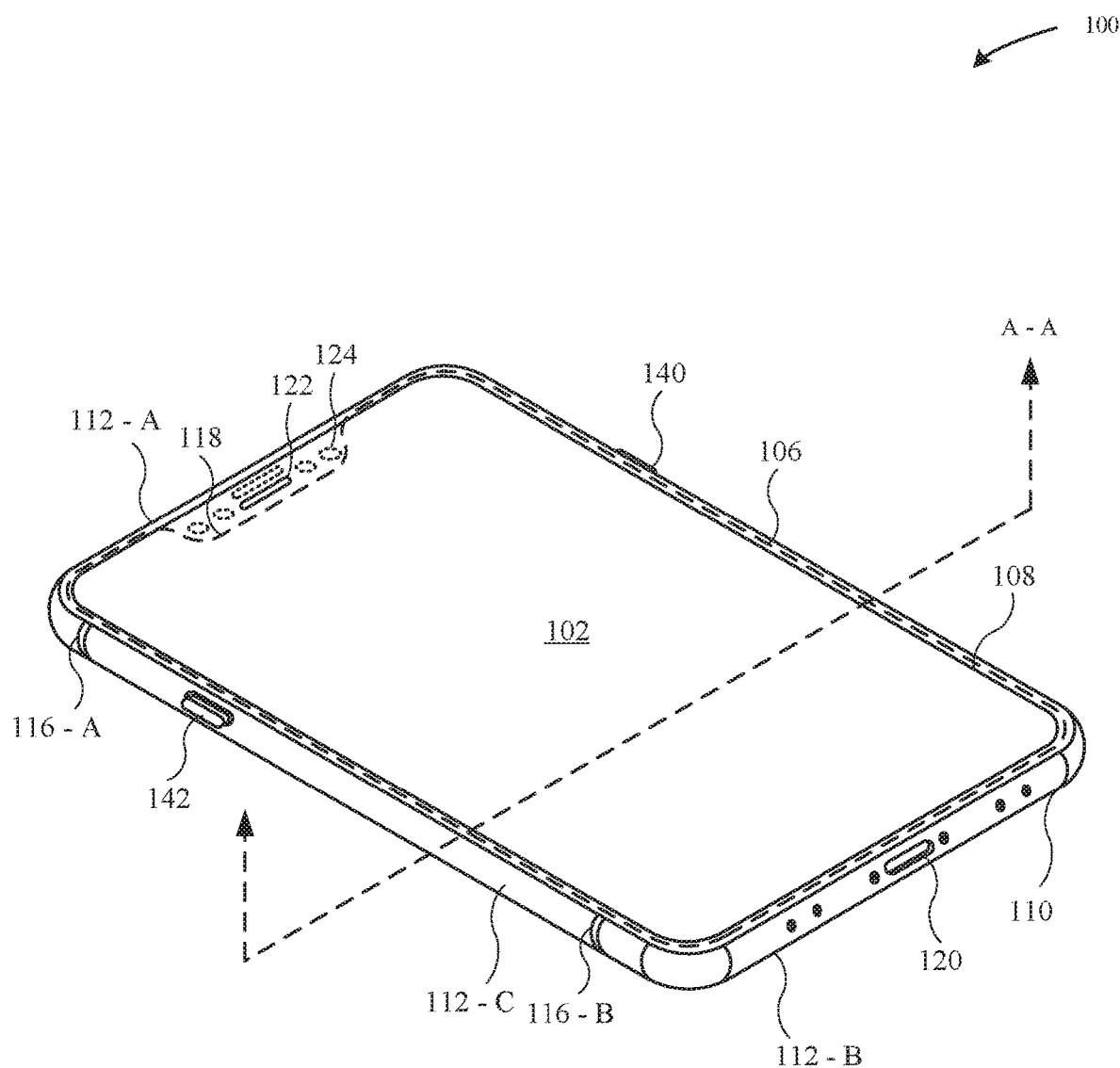
FIGS. 1A-1B illustrate perspective views of a portable electronic device that includes a flexible cable for transmitting data signals between operational components, in accordance with some embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The embodiments described herein relate generally to a flexible cable that is capable of electrically connecting operational components of a portable electronic device. In particular, the various embodiments relate to a single flexible cable that incorporates multiple data signal transmission lines. As described herein, the data signal transmission line can include radio-frequency (RF) signals. As described herein, the term "flexible" can refer to a material that is capable of deforming from its original shape, and subsequently, when deformed, capable of returning to its pre-deformed shape with little to no loss in structural rigidity, stiffness, and material composition. In some examples, the flexible material can refer to a thermoplastic material.

Although recent technological advances and increased consumer demand have led the drive for manufacturers to incorporate additional operational components (e.g., processors, antennas, front cameras, rear cameras, haptic feedback components, etc.) into portable electronic devices such as a task becomes progressively more challenging due to the small cavities of the enclosures of these portable electronic devices. Further problematic, each of these additional operational components requires a cable to transmit/receive data signals with one or more processors (e.g., via a logic board). In some examples, each cable (e.g., coaxial cable) is characterized as having a round shape which is generally incompatible with the shapes of these portable electronic devices (e.g., smart phones, tablets, laptops, etc.), which have more angular shapes (e.g., cuboid). Therefore, it is challenging to incorporate these multiple operational components into these portable electronic devices.

Further complicating matters is that conventional portable electronic devices incorporate numerous electrical components that themselves generate signal noise and/or are susceptible to performance degradation due to external electromagnetic interference (EMI). While conventional cables may incorporate protection mechanisms for EMI shielding and grounding elements, these protection mechanisms are generally fraught with structural and/or material inconsistencies. As an example, coaxial cables may lack a continuous layer for shielding an underlying data signal line. Furthermore, ribbon cables generally include multiple conducting wires running parallel to each other, but each ribbon cable is capable of carrying only a single data signal line (i.e., the same data signal line across the multiple conducting wires). Moreover, conventional ribbon cables may interfere with peripheral components with portable electronic devices due to their awkward shape, length, and size.

To cure the aforementioned deficiencies, the systems and technique described herein relate to a single flexible cable having a variable cross-section so as to accommodate different dimensions of a cable pathway. Furthermore, the single flexible cable is capable of carrying multiple data signal transmission lines. Beneficially, the single flexible cable described herein is capable of incorporating antenna arrays, switching components, sensors, and the like. Furthermore, the single flexible cable described herein incorporates matching components (e.g., antenna lines, etc.) and/or non-matching components (e.g., non-antenna lines and antenna lines), thereby significantly increasing the utility of the single flexible cable as a multi-diverse electrical connector for operational components. Beneficially, relative to conventional cables, the single flexible cable described herein promotes stronger signal integrity, less susceptibility to signal noise, more diverse grounding opportunities, and greater adaptability to variable local dimensions of a cable pathway.

According to some embodiments, a cable for a portable electronic device, where the portable electronic device includes operational components having connectors that are capable of being electrically coupled to the cable, is described. The cable includes a dielectric substrate that encloses grounding planes, a first signal transmission line that is overlaid by one of the grounding planes, and a second signal transmission line, where the first and second signal transmission lines are disposed between the grounding planes, and the dielectric substrate is capable of electromagnetically shielding the first and second signal transmission lines.

These and other embodiments are discussed below with reference to FIGS. 1A-1B, 2-3, 4A-4D, 5A-5C, 6A-6B, and 7-8. However, those skilled in the art will readily appreciate that the detailed description given herein with respect to these figures is for explanatory purposes only and should not be construed as limiting.

Figure 1B:
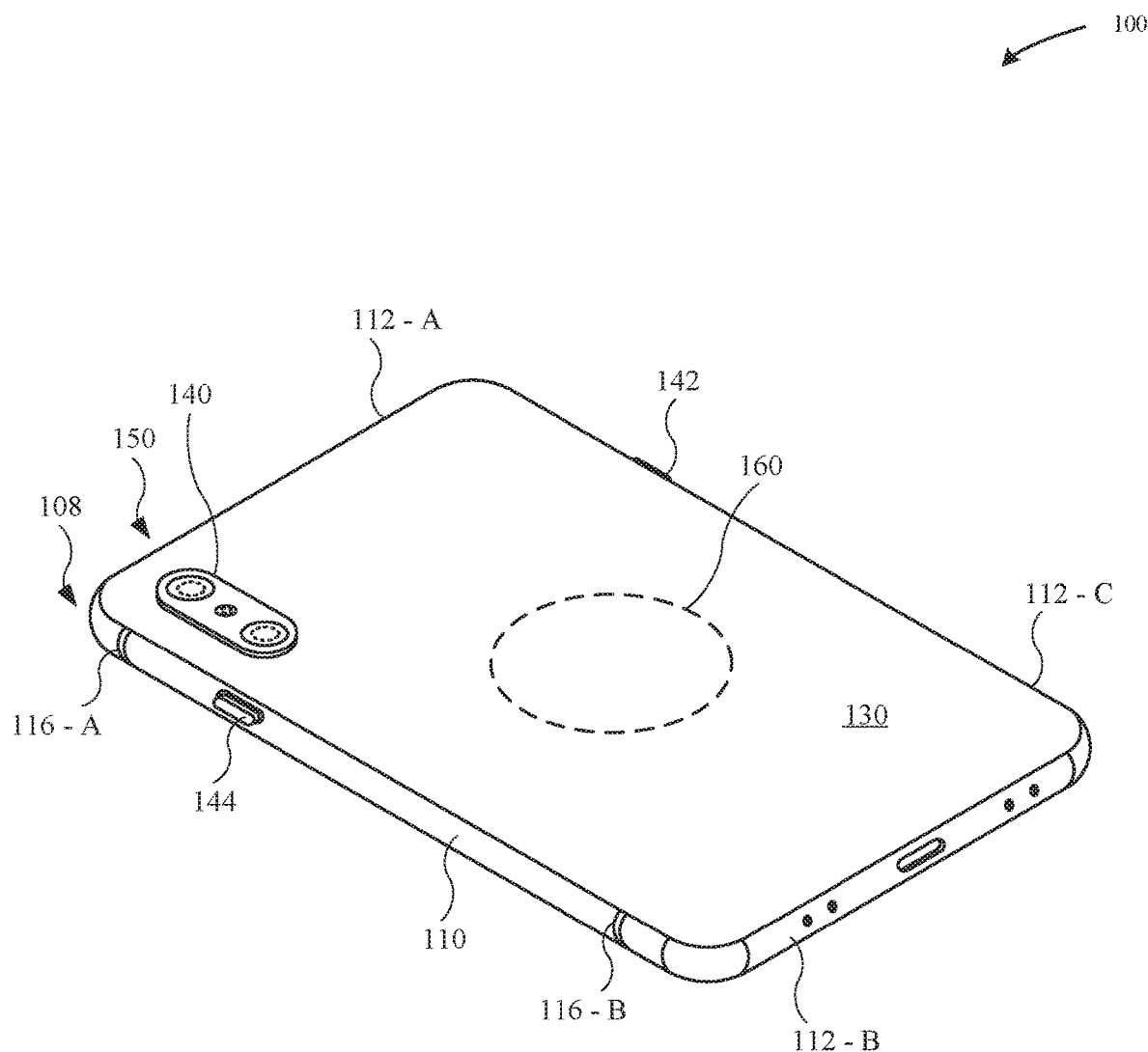

FIGS. 1A-1B illustrate a portable electronic device that includes support structures, in accordance with various embodiments. In particular, the support structures are capable of supporting operational components that are carried within a cavity of an enclosure of the portable electronic device. According to some examples, the portable electronic device can include a computing device, a smartphone, a laptop, a smartwatch, a fitness tracker, a mobile phone, a wearable consumer device, and the like. The enclosure of the portable electronic device can also be referred to as a housing.

FIG. 1A illustrates a first perspective view of the portable electronic device 100, where the portable electronic device 100 includes an enclosure 110 having walls that define a cavity (not illustrated), where one or more operational components are carried within the cavity. The enclosure 110 includes a top wall 112-A, a bottom wall 112-B, and side walls 112-C.

FIG. 1A illustrates that the portable electronic device 100 includes a display assembly 102 that covers a majority of a top surface of the enclosure 110. The display assembly 102 can include a capacitive unit and/or a force detection unit that is capable of detecting an input at the display assembly 102 and presenting a corresponding graphical output at the display assembly 102. In some embodiments, the display assembly 102 is overlaid by a protective cover 108, where the protective cover 108 is secured with a trim structure 106. In particular, the trim structure 106 may be joined to the enclosure 110 with an attachment feature, such as an adhesive, a weld, and the like. The protective cover 108 may prevent surface abrasions and scratches from damaging the display assembly 102. The protective cover 108 may be formed from a transparent material, such as glass, plastic, sapphire, or the like.

In some embodiments, the top wall 112-A may be separated from the bottom wall 112-B by a dielectric material 116-A, B, and the side walls 112-C may be separated from the top wall 112-A and the bottom wall 112-B by the dielectric material 116-A, B. The dielectric material 116-A, B can include plastic, injection-molded plastic, polyethylene terephthalate ("PET"), polyether ether ketone ("PEEK"), ceramic, and the like. By incorporating the dielectric material 116-A, B, the walls 112-A, B, C are capable of being electrically isolated from each other.

According to some embodiments, the portable electronic device 100 includes a protruding trim structure 140 and a switch 142 that are carried along the side wall 112-C. The bottom wall 112-B includes a connector 120 that is capable of providing data and/or power to the portable electronic device 100. In some examples, the connector 120 refers to a bus and power connector.

According to some embodiments, the portable electronic device 100 includes a notch 122 in proximity to the top wall 112-A. As illustrated in FIG. 1A, the notch 122 is defined by a cut-out of the protective cover 108. The notch 122 includes one or more electronic components 124 (e.g., infrared detector, front-facing camera, etc.). In some examples, the one or more electronic components 124 may be utilized for facial recognition. It should be noted that the supporting structures described herein may be utilized to secure these electronic components 124 such as to prevent these electronic components 124 from becoming dislodged or misaligned when the portable electronic device 100 experiences a load event.

According to some examples, at least one of the top wall 112-A, the bottom wall 112-B, or the side wall 112-C may be formed of material other than metal. Beneficially, the use of non-metal material can reduce the amount of electromagnetic interference associated with the enclosure 110 and a wireless transceiver that is carried within the enclosure 110. Additionally, the use of non-metal material reduces the amount of parasitic capacitance between any metal support structures that are carried within the cavity and the enclosure 110. According to some examples, the non-metal material includes glass, plastic, ceramic, and the like. Although non-metal material such as glass is beneficial in permitting electromagnetic waves to pass through the enclosure 110, the glass is also more susceptible than metal to cracking or deforming when the portable electronic device 100 experiences a drop event.

According to some embodiments, the portable electronic device 100 carries one or more operational components within a cavity (not illustrated) of the portable electronic device 100. These operational components may include a circuit board, an antenna, a multi-core processor, a haptic feedback module, a camera, a sensor, an IR detector, an inductive charging coil, and the like. It should be noted that the operational component can generate a large amount of thermal energy, e.g., between about 60 W-100 W of thermal energy. Indeed, circuits and processors are capable of generating a large amount of thermal energy due to constant switching of transistors. Because the operational component can generate a large amount of thermal energy (e.g., heat, etc.), the enclosure 110, such as the side walls 112-C can absorb a significant amount of the thermal energy which can render a feeling of discomfort when a user handles the portable electronic device 100. Furthermore, generating a large amount of thermal energy may lead to increasing operating temperature within the portable electronic device 100; thus, leading to decreased operating performance and potential premature failure of components.

Additionally, the amount of the thermal energy that is absorbed by the enclosure 110 is further exacerbated by the materials of the enclosure 110. In particular, the materials of the enclosure 104 may have a low rate of thermal conductivity. For example, the enclosure 110 can include one or more types of materials such as metal, polymers, glass, ceramic, and the like. In some examples, the metal can include at least one of a steel alloy, aluminum, aluminum alloy, titanium, zirconium, magnesium, copper, and the like. In some examples, the enclosure 110 can include a metal oxide layer that is formed from a metal substrate.

FIG. 1B illustrates a second perspective view of the portable electronic device 100, in accordance with some embodiments. As illustrated in FIG. 1B, an operational component 150 is carried at least in part within a protruding trim structure 140. The protruding trim structure 140 is disposed in proximity to a corner 108 of the enclosure 110. In some examples, proximity may refer to the operational component 150 is a distance of less than about 50 mm from the corner 108. As illustrated in FIG. 1B, the operational component 150 is a camera system having dual lenses (e.g., wide and a telephoto, etc.). Additionally, the camera system may include a flash module.

As illustrated in FIG. 1B, the protruding trim structure 140 is secured to and extends from a back wall 130 of the portable electronic device 100. According to some examples, the back wall 130 is formed of a material other than metal. The non-metal material enables a magnetic field to pass through the enclosure 110 in order to charge wireless charging coils 160, such as magnetic cores that include ferrites.

Figure 2:
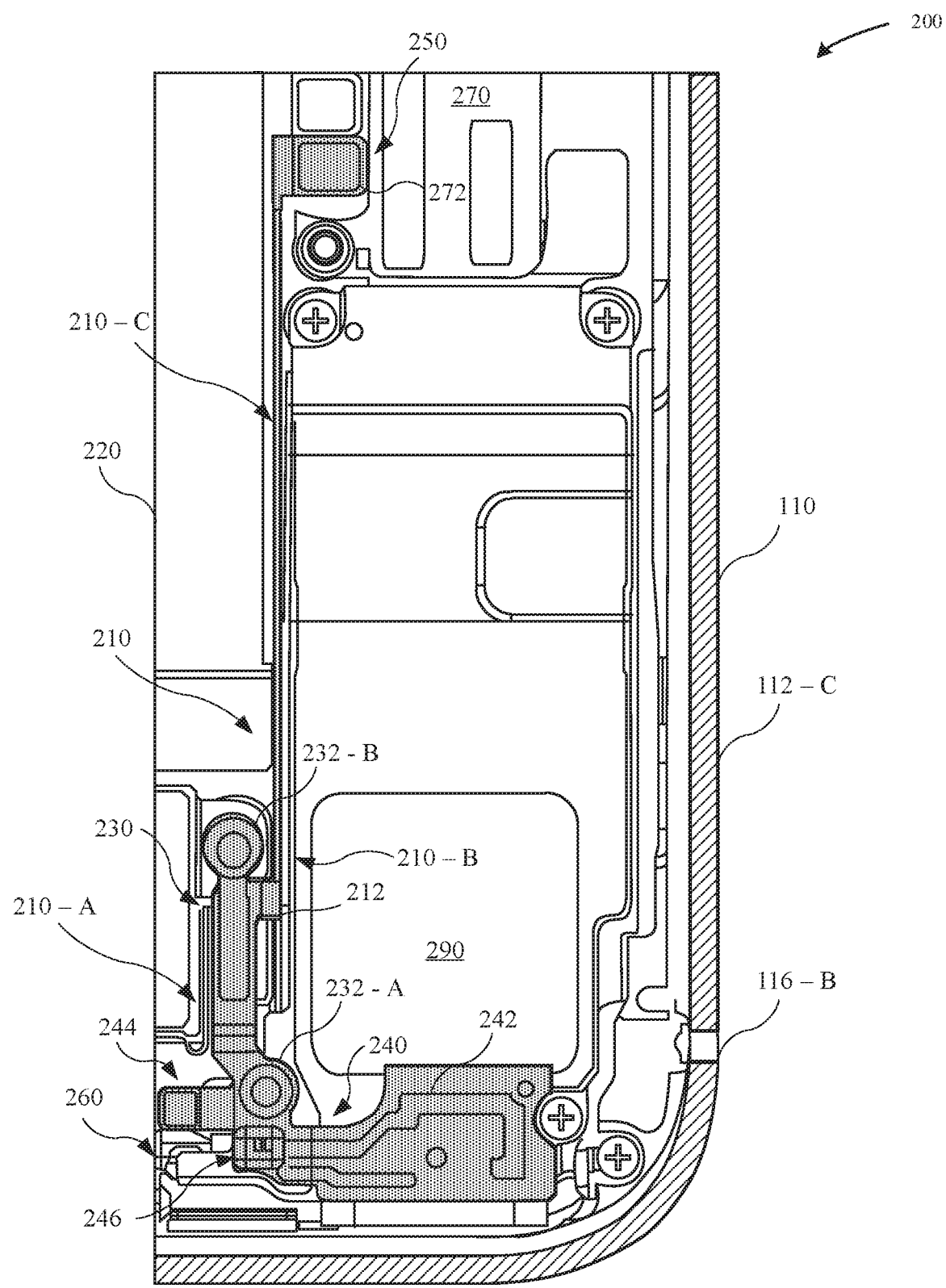
FIG. 2 illustrates a top view of a portable electronic device that includes a flexible cable for transmitting data signals between operational components, in accordance with some embodiments.

FIG. 2 illustrates a partial overhead view of internal components of a portable electronic device 200 taken along the A-A reference line of the portable electronic device 100, in accordance with some embodiments. In particular, FIG. 2 illustrates the portable electronic device 200 without a display assembly 102 and a protective cover 108, thereby revealing a flexible cable 230 that is carried within a cavity of the enclosure 110. According to some examples, the enclosure 110 is formed of metal, such as stainless steel, aluminum, titanium, and the like such that the enclosure 110 functions as an active antenna.

As illustrated in FIG. 2, the portable electronic device 200 carries operational components—e.g., a power supply unit 220 (e.g., lithium-ion battery, etc.), an antenna 260, a logic board 270, and a wireless transceiver 290. According to some examples, these operational components are separated by a cable pathway 210. In particular, FIG. 2 illustrates the cable pathway 210 that is capable of electrically connecting the logic board 270 and the antenna 260 and the wireless transceiver 290. In some embodiments, the flexible cable 230 is capable of electrically connecting matching components (e.g., antenna lines, etc.) and/or non-matching components (e.g., non-antenna lines and antenna lines).

As illustrated in FIG. 2, a first end of the flexible cable 230 is electrically joined to the logic board 270. The flexible cable 230 is capable of transmitting one or more radio-frequency (RF) signals between these operational components. In some examples, the logic board 270 includes a liquid crystal polymer substrate. The logic board 270 includes a connector 272 with pins—e.g., a connector with a single row of pins (MLC) or a connector with multiple rows of pins (MLD). In contrast to coaxial cable connectors, the flexible cable 230 is capable of utilizing the connector 272 to transmit/receive multiple different data signals (e.g., three data signals, four data signals, etc.) from the logic board 270. Whereas a single coaxial cable is capable of only providing a single data signal transmission line. Consequently, providing multiple coaxial cables with different multiple data signal transmission lines would require multiple connectors electrically coupled to a logic board. Beneficially, utilizing the connector 272 with the flexible cable 230 permits for increased space-efficiency in a small cable pathway, especially when multiple different data transmission signals are being transmitted between these operational components.

As illustrated in FIG. 2, the flexible cable 230 traverses through different sections of the cable pathway 210—e.g., a first section 210-A, a second section 210-B, and a third section 210-C. It should be noted that each of these sections of the cable pathway 210 have different dimensions (e.g., surface area, height, etc.) which places certain restrictions on the dimensions of the flexible cable 230 that passes through these different sections of the cable pathway 210. As will be described in greater detail with reference to FIGS. 4A-4D, the flexible cable 230 is characterized as having a variable cross-section such that different sections of the flexible cable 230 accommodate for the different dimensions of the different sections of the cable pathway 210.

As illustrated in FIG. 2, the flexible cable 230 diverges or splits to terminate into a coaxial connection 244 with the antenna 260 and a flex cable connection 240 with the wireless transceiver 290. In particular, the flexible cable 230 is illustrated as having integrated antenna traces 242. Beneficially, because the flexible cable 230 has a flexible cable connection 240, there is no need to modify the flexible cable 230 (e.g., form soldering connections) to electrically couple with the wireless transceiver 290. According to some embodiments, the flexible cable 230 may incorporate integrated switching components(s) 246 that enable the flexible cable 230 to switch between transmitting data signals between the coaxial connection 244 established with the antenna 260 and the flex cable connection 240 with the wireless transceiver 290. Additionally, the flexible cable 230 is capable of incorporating any combination of RF signals or antenna signals into a single flexible cable. In some examples, the multiple RF signals and/or antenna signals may be transmitted by the flexible cable 230 at least one of sequentially, concurrently, or simultaneously. Although FIG. 2 illustrates the flexible cable 230 include coaxial connections and flexible cable connections, the flexible cable 230 is capable of terminating and electrically coupling with operational component(s) using at least one of a hot bar connector, board-to-board connector, coaxial connector, or surface mounted connector (SMT).

As illustrated in FIG. 2, the flexible cable 230 includes integrated system ground contacts 232-A, B. Although in other examples, the flexible cable 230 may include exposed ground surface(s)/contact(s) that come into direct contact with a grounding element 212 of the portable electronic device 200. Beneficially, making direct contact between the grounding element 212 and a grounding surface/plane of the flexible cable 230 results in promoting stronger signal integrity. Additionally, the flexible cable 230 may be simply adhered or mounted onto the grounding element 212 to ground together the flexible cable 230 to the portable electronic device 200 (e.g., a chassis of the portable electronic device). Whereas a single coaxial cable includes an annular grounding ring that surrounds only a single data signal transmission line.

As illustrated in FIG. 2, the flexible cable 230 is situated in an operating environment with the presence of signal noise and operational components that are capable of generating electromagnetic interference (EMI). In order to minimize and/or prevent signal noise and EMI issues, the flexible cable 230 may be strategically located further from operational components—e.g., processors of the logic board. Beneficially, because the flexible cable 230 has a variable cross-section design, the flexible cable 230 may be strategically located in regions with minimal signal noise and/or susceptibility to EMI, thereby significantly reducing signal noise associated with data signal transmission.

Additionally, FIG. 2 illustrates that the portable electronic device 200 does not include clips, springs, or other mounting hardware that is generally associated with mounting coaxial cables. Indeed, clips and springs are generally inefficient at maximizing available space due to their inability to scale-down to different cross-sections of a cable pathway. In other words, the shapes of these clips and springs are generally inflexible and their shapes are not adaptable to the different cross-sections of the cable pathway. In contrast, the flexible cable 230 has a variable cross-section while still promoting excellent signal integrity.

Figure 3:
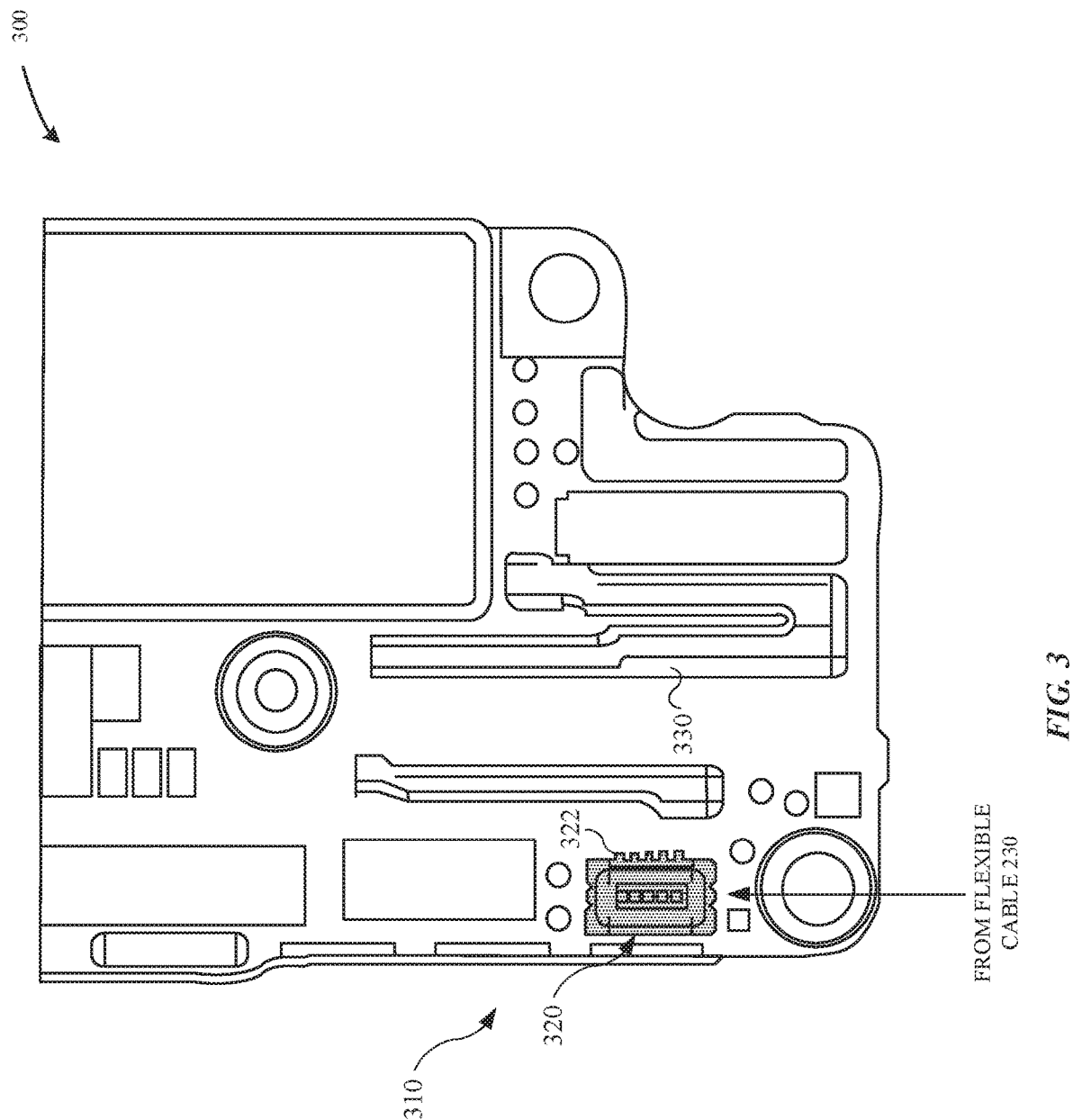
FIG. 3 illustrates a top view of a circuit board that is capable of being electrically connected to a flexible cable, in accordance with some embodiments.

FIG. 3 illustrates a partial overhead view of a logic board 300, in accordance with some embodiments. In some examples, the logic board 300 corresponds to the logic board 270, as illustrated in FIG. 2. As illustrated in FIG. 3, logic board 300 includes a substrate 310, such as liquid crystal polymer. In some examples, the logic board 300 is electromagnetically shielded. According to some examples, the logic board 300 includes a data storage device, non-volatile computer readable storage medium, one or more processors, and the like.

The logic board 300 includes a connector 320 with pins 322—e.g., an MLC connector or an MLD connector. The connector 320 is capable of being electrically coupled to the flexible cable 230. In contrast to a coaxial cable connection, the connector 320 is capable of transmitting and/or receiving multiple data signal transmission lines by way of the pins 322. In other words, the connector 320 illustrated in FIG. 3 may be capable of transmitting and/or receiving up to three data signal transmission lines. However, increasing the number of data signal transmission line—e.g., five data signal transmission lines may merely involve incorporating an additional row of pins 322 into the connector 320. In this manner, the connector 320 imparts increased space-efficiency in a small cable pathway in contrast to conventional connectors.

Figure 4A:
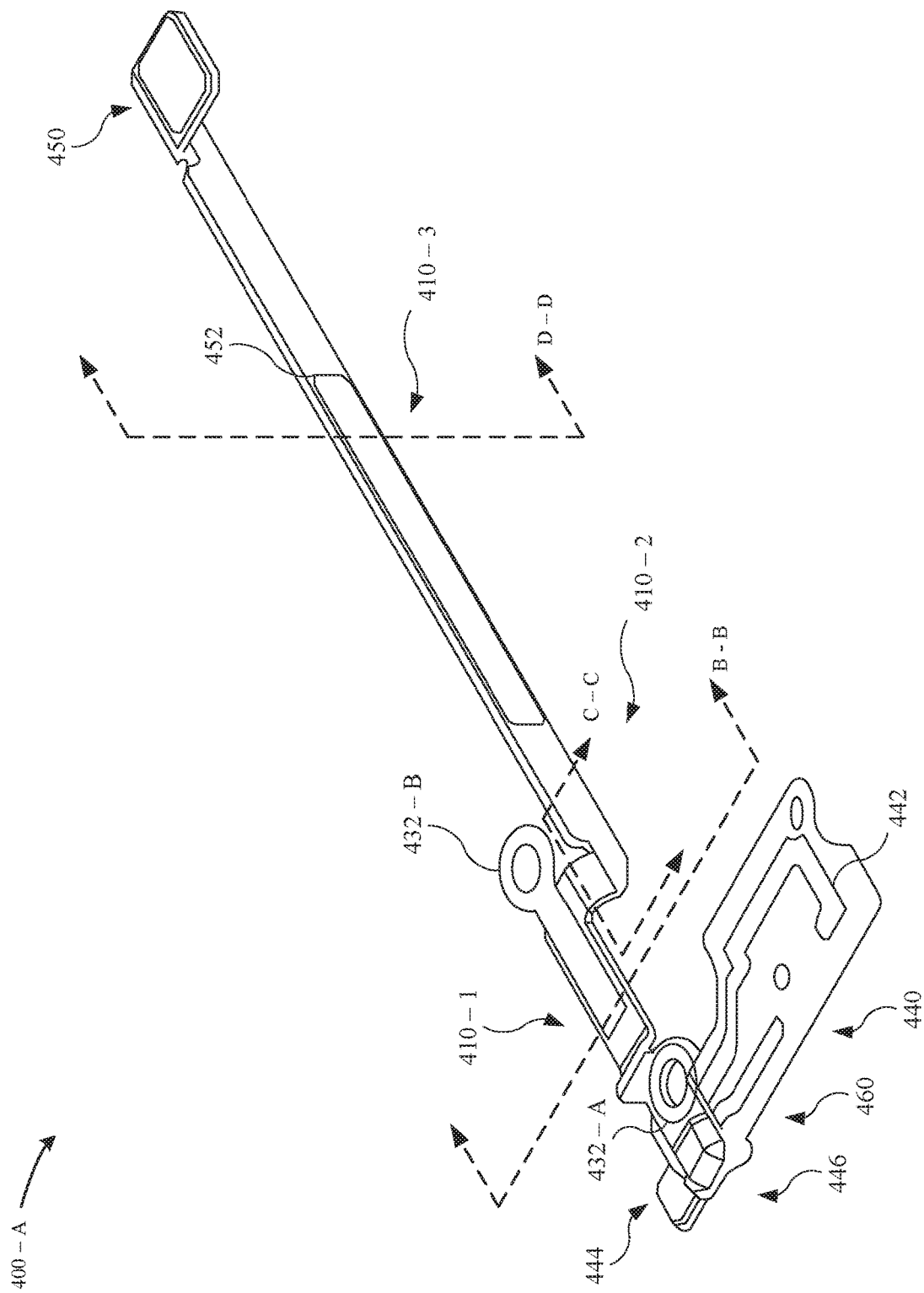
FIGS. 4A-4D illustrate various views of a flexible cable for transmitting data signals between operational components, in accordance with some embodiments.

FIGS. 4A-4D illustrate various views of a flexible cable 400 that is capable of transmitting data signals between operational components of a portable electronic device, in accordance with some embodiments. In some examples, the flexible cable 400 corresponds to the flexible cable 230, as illustrated in FIG. 2. As illustrated in FIG. 4A, the flexible cable 400 includes a first end 450 that is electrically coupled to a logic board—e.g. the logic board 300. The flexible cable 400 further includes a second end 460 that splits into a first terminal connection—e.g. a coaxial connection 444 for the antenna—e.g. the antenna 260 and a second terminal connection e.g. a flexible cable connection 440 for the wireless transceiver—e.g. the wireless transceiver 290. In some examples, the flexible cable 400 includes an integrated switching component 446 that is capable of switching the data transmission signals between the first and second terminal connections so as to permit a defined amount of electromagnetic power to pass through. As illustrated in FIG. 4A, the flexible cable connection 440 is electrically coupled to antenna traces 442. Indeed, the flexible cable 400 includes separate data signal transmission lines for each of the antenna and the wireless transceiver. Although it should be noted that the flexible cable 400 is capable of including any number of data signal transmission lines due to its architecture and generally polygonal and/or flat structure, as will be described in greater detail with reference to FIGS. 6A-6B.

As illustrated in FIG. 4A, the flexible cable 400 includes separate RF signal transmission lines 452 for the antenna and the wireless transceiver. In other words, the flexible cable 400 includes dedicated data signal transmission lines for each passing data signals to/from the antenna and the wireless transceiver while packaging these dedicated data signal transmission lines into a single package having a variable cross-section. In some examples, the multiple RF signals and/or antenna signals may be transmitted by the flexible cable 400 at least one of sequentially, concurrently, or simultaneously.

The flexible cable 400 includes grounding elements 432-A, B that are capable of grounding the flexible cable 400, such as to the chassis of the portable electronic device—e.g., the portable electronic device 100. In other examples, the flexible cable 400 may include exposed ground planes that are capable of being in direct contact with a grounding contact of the portable electronic device.

As illustrated in FIG. 4A, the flexible cable 400 is characterized as having a variable cross-section. In particular, the flexible cable 400 includes a first section 410-1 having a first cross-section reference line B-B, a second section 410-2 having a second cross-section reference line C-C, and a third section 410-3 having a third cross-section reference line D-D. Each of these sections 410-1, 2, 3 have different cross-sections so as to enable the flexible cable 400 to fit in a small cable pathway having a non-linear geometry (e.g., circular, stepped, etc.). Indeed, due to the flexible characteristics of the dielectric substrate material that forms the flexible cable 400, the flexible cable 400 is associated with an ample bend radius that enables the flexible cable 400 to negotiate tight junctions between structural components/operational components.

Figure 4B:
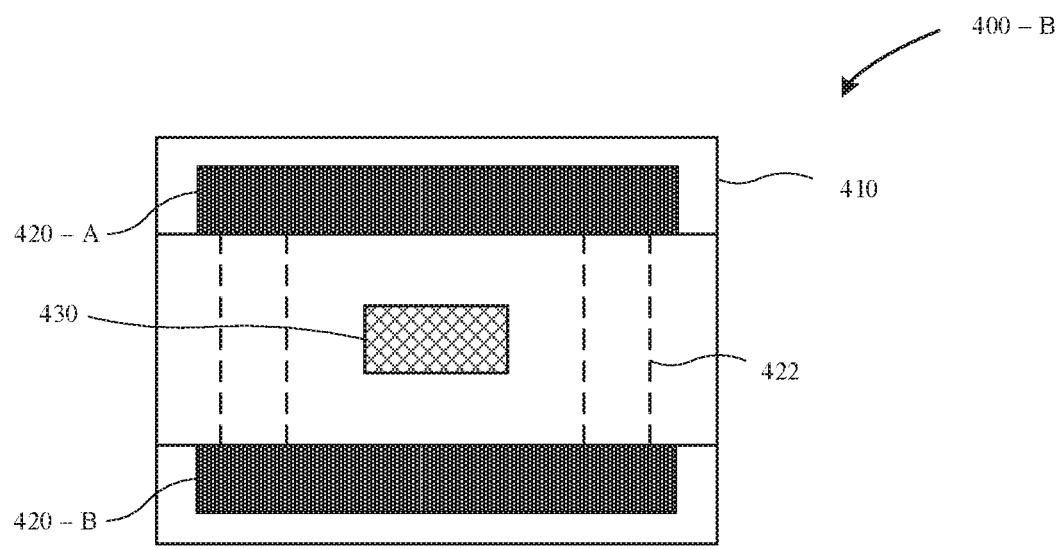
Figure 4C:
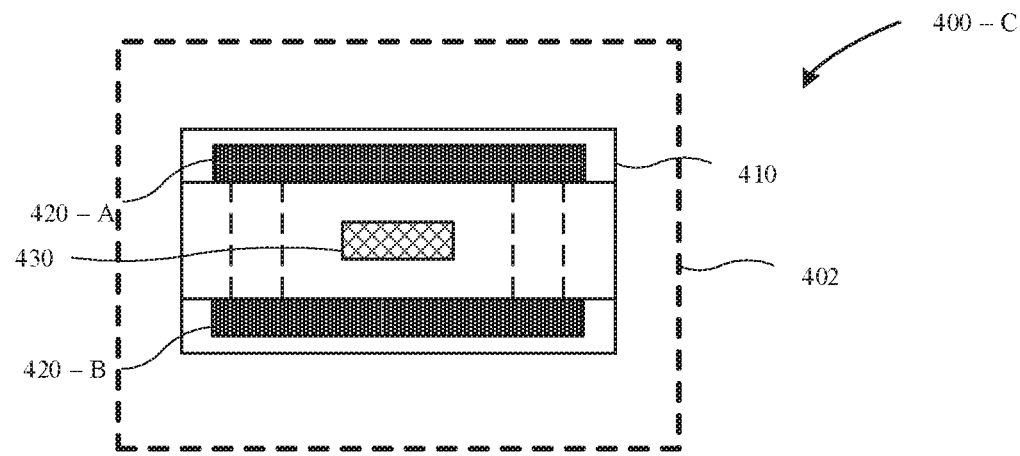
Figure 4D:
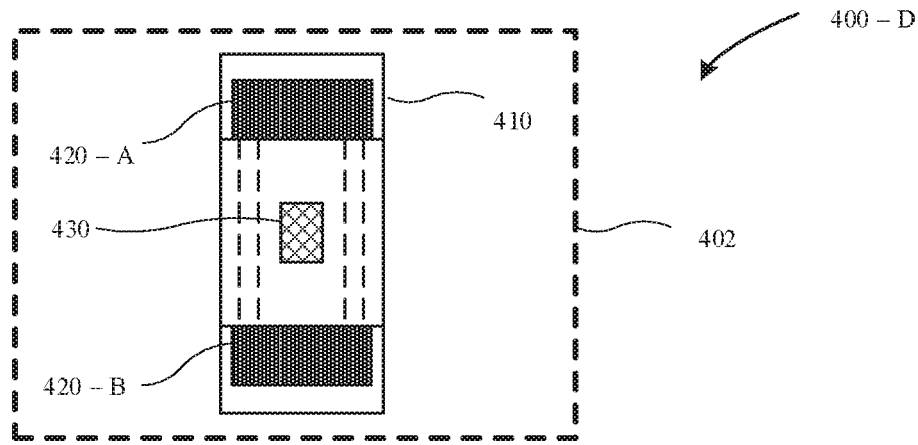

FIGS. 4B-4D illustrate the variable cross-section of the flexible cable 400 of FIG. 4A, in accordance with some embodiments. FIG. 4B illustrates a flexible cable 400-B that corresponds to the first cross-section reference line B-B. The flexible cable 400-B includes a dielectric substrate 410 having dielectric material, such as glass, ceramic, plastic, and the like. Although in some examples, the flexible cable 400-B is preferably made from a material, such as plastic that is capable of bending. The dielectric substrate 410 surrounds and covers a first grounding plane 420-A and a second grounding plane 420-B. In some examples, the first and second grounding planes 420-A, B span an entire width of the dielectric substrate 410. In other examples, the first and second grounding planes 420-A, B may span a partial width of the dielectric substrate 410. In some examples, the first and second grounding planes 420-A, B are characterized as having polygonal shape (e.g., rectangular, etc.) or a planar shape. Beneficially, this enables the flexible cable 400-B to negotiate tight junctions.

According to some examples, the dielectric substrate 410 is capable of providing electrical insulating properties for a data signal transmission line 430. Additionally, the dielectric substrate 410 is capable of providing electromagnetic shielding against ambient EMI from the operating environment. The dielectric substrate 410 may be a shield that surrounds the data signal transmission line 430. Beneficially, the architecture of the dielectric substrate 410 may impart improved uniform shielding for the data signal transmission line 430 that enables the data signal transmission line 430 to operate at higher frequencies. Indeed, it is difficult to ensure uniform shielding for coaxial cables. In some examples, the dielectric substrate 410 can reflect electromagnetic energy waves. In some examples, the dielectric substrate 410 can pick up noise and conduct it to ground. Additionally, the dielectric substrate 410 protects the data signal transmission line 430 from abrasions, moisture, debris, and the like.

FIG. 4B illustrates that the data signal transmission line 430 is disposed between the first and second grounding planes 420-A, B. In some examples, the data signal transmission line 430 is capable of transmitting an RF signal. In some examples, the data signal transmission line 430 is also characterized as having a polygonal shape or a planar shape or a shape that corresponds to the shape of the dielectric substrate 410. In some examples, the data signal transmission line 430 is equidistant from the first and second grounding planes 420-A, B. The first and second grounding planes 420-A, B may be grounded together with a grounding element 422. Additionally, the data signal transmission line 430 may be tied to a ground. In some examples, the material of the dielectric substrate fills the flexible cable 400-B. According to some examples, the data signal transmission line 430 is formed of copper, a copper alloy, aluminum, and the like.

In some examples, one or more of the grounding planes 420-A, B or the data signal transmission line 430 has a generally polygonal shape, planar shape, or asymmetrical shape. In some examples, the dielectric substrate 410 may be characterized as having a generally polygonal shape, planar shape, or asymmetrical shape. However, preferably, the dielectric substrate 410 may be of a planar shape so as to fit within tight junctions of a cable pathway—e.g. the cable pathway 210. In contrast, coaxial cable connections are generally characterized as having only a rounded shape. However, this rounded shape is generally space inefficient and makes it difficult to incorporate multiple coaxial cable connections in a small cable pathway. Furthermore, because each coaxial cable connection is only capable of transmitting a single data signal transmission line, multiple coaxial cable connections quickly make it cumbersome to utilize in small cavities, especially as portable electronic devices incorporate additional components.

FIG. 4C illustrates a flexible cable 400-C that corresponds to the second cross-section reference line C-C. The flexible cable 400-C is similar to the construction of the flexible cable 400-B, except that the cross-section of the flexible cable 400-C is smaller than the flexible cable 400-B as indicated by the reference outline 402 that corresponds to the dimensions of the flexible cable 400-B. Indeed, the cross-section of the flexible cable 400-C may be smaller than the flexible cable 400-B such that the flexible cable 400-C is capable of bending along a tight radius, as illustrated in FIG. 4A. It should be noted that the aspect ratio of the flexible cable 400-C is similar to the aspect ratio of the flexible cable 400-B.

FIG. 4D illustrates a flexible cable 400-D that corresponds to the third cross-section reference line D-D. The flexible cable 400-D is similar to the construction of the flexible cable 400-B, C, except that the cross-section of the flexible cable 400-D is elongated in a vertical manner. Indeed, the cross-section of the flexible cable 400-D no longer corresponds to the aspect ratio of the flexible cable 400-B, C so that the flexible cable 400-D is capable of fitting within a narrow pathway, as illustrated in FIG. 4A.

As illustrated in FIGS. 4A-4D, the flexible cable 400-B, C, D incorporates a continuous grounding plane—e.g., the grounding planes 420-A, B throughout the length and width of the flexible cable 400-B, C, D. Additionally the continuous grounding plane(s) are also incorporated into the connections that the flexible cable 400-B, C, D establishes with the operational components. Beneficially, the continuous grounding planes ensures that the data signal transmission line 430 is entirely surrounded by the grounding planes, which ensures better signal insulation. Indeed, coaxial cable connections are fraught with exposed areas that are unintentionally shielded, thereby degrading signal quality.

Additionally, as described in the various embodiments illustrated in FIGS. 4A-4D, the RF performance of the data signal transmission lines can be tuned to match the available dimensional constraints of the cable pathway 210. For example, if the cable pathway passes through a tight junction, then the thickness of the flexible cable 400-B, C, D may be reduced to improve RF performance in that tight junction so as to ensure that RF performance does not suffer. In other words, the thickness, shape, and dimensions of the flexible cable 400-B, C, D adapt to the different sections of the cable pathway 210. In another example, if the flexible cable 400-B, C, D passes through a junction of the cable pathway 210 that is exposed to signal noise or numerous switching of components, the thickness of the dielectric substrate 410 can be increased to increase the EMI shielding at a local level.

In some examples, the thickness of the flexible cable 400-B, C, D is between about 0.10 mm to about 0.6 mm. This reduced thickness relative to coaxial cables is due in part to utilizing the same dielectric substrate and the same grounding planes for shielding multiple data signal transmission lines instead of duplicating each of these layers for each data signal transmission line as is the case for coaxial cables.

Figure 5A:
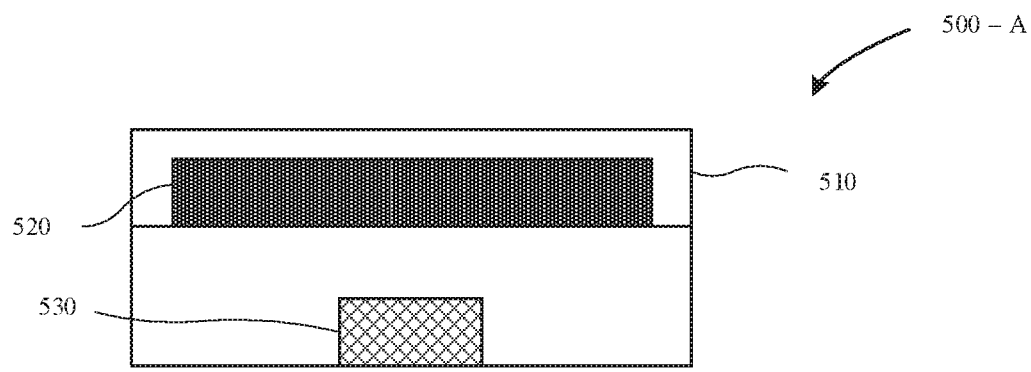
FIGS. 5A-5C illustrate various embodiments of a flexible cable for transmitting data signals between operational components, in accordance with some embodiments.
Figure 5B:
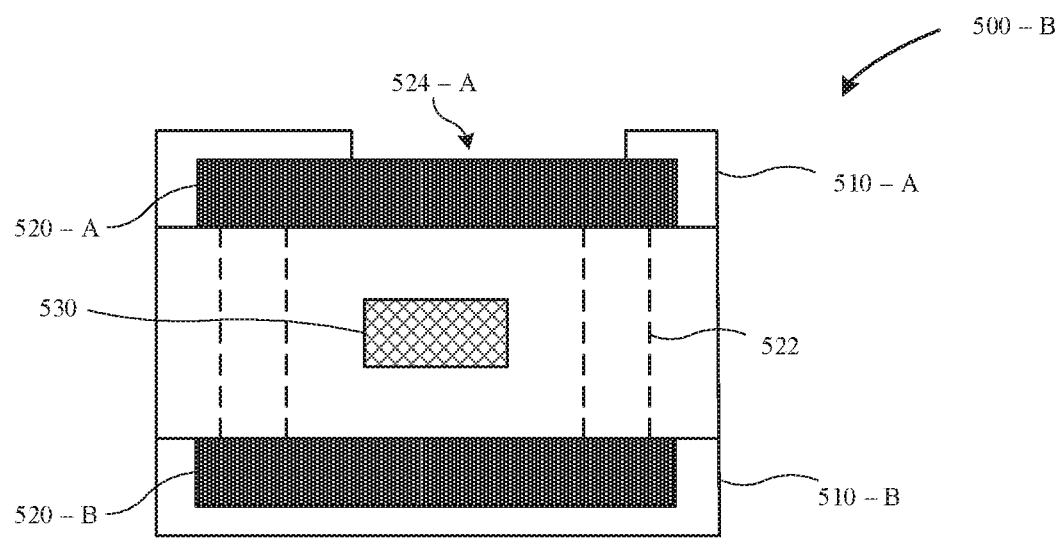
Figure 5C:
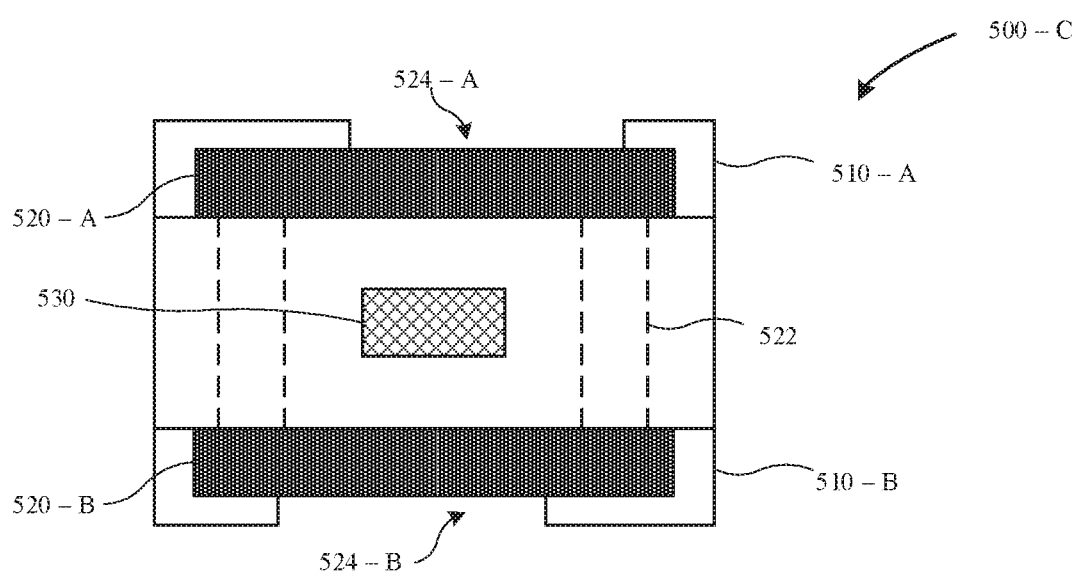

FIGS. 5A-5C illustrate cross-sectional views of various embodiments of a flexible cable—e.g., the flexible cable 500-A, B, C that is capable of transmitting data signals between operational components of a portable electronic device, in accordance with some embodiments. In some examples, the flexible cable corresponds to the flexible cable 230, as illustrated in FIG. 2.

As illustrated in FIG. 5A, the flexible cable 500-A includes a dielectric substrate 510 having dielectric material. The dielectric substrate 510 surrounds and covers a single grounding plane 520. Additionally, in contrast to the flexible cable 400-B, C, D, the flexible cable 500-A lacks a lower grounding plane. Instead the flexible cable 500-A is characterized as having a two-layer architecture where a data signal transmission line 530 is directly exposed to a chassis or grounding element of the portable electronic device that is situated just below the data signal transmission line. In some examples, the data signal transmission line 530 is referred to as a micro strip. In some examples, the dielectric substrate 510 does not surround the data signal transmission line 530.

As described herein, one or more portions of the upper and/or lower dielectric substrate 510-A, B may be removed from any one of the embodiments of the flexible cable—e.g., the flexible cable 500-A as described herein such as to directly expose the data signal transmission line 530. In other words, direct exposure may mean that the data signal transmission line 530 is not enclosed by any material (e.g., dielectric substrate 510, etc.). As a result, the data signal transmission line 530 is directly exposed to an external environment of the portable electronic device such that any type of surface-mounted device (SMD) component or through-hole component may be directly attached to a surface of the data signal transmission line 530. For example, directly exposing the data signal transmission line 530 significantly increases the functionality of the flexible cable 500-A to also include passive circuits, active circuits, and/or electromechanical components, which represents a significant advantage over conventional coaxial cables. Although FIG. 5A illustrates a single data signal transmission line 530, it should be noted that the flexible cable may include any number of data signal transmission lines that are directly exposed to the external environment.

FIG. 5B illustrates a cross-section of a flexible cable 500-B where a portion 524-A of an upper dielectric substrate 510-A is removed so as to expose an upper grounding plane 520-A. In other words, the external surface of the upper grounding plane 520-A corresponds to a portion of an exterior surface of the flexible cable 500-B. In some examples, the upper grounding plane 520-A is directly in contact with a grounding contact of the portable electronic device. In some examples, the portion 524-A of the upper dielectric substrate 510-A may be selectively removed in order to strategically ground the upper grounding plane 520-A with the specific location of the grounding contact of the portable electronic device while preserving the benefits of the EMI shielding and electrical insulating properties of the upper dielectric substrate 510-A throughout a majority of the external surface of the flexible cable 500-B. This is in contrast to coaxial cables, where there is a general inability to selectively remove only portions of a dielectric substrate so as to expose a grounding plane to only a position of a grounding contact of the portable electronic device. Beneficially, the flexible cable 500-B does not require any specialized grounding plane along the portable electronic device, as the flexible cable 500-B may be merely pressed against a printed circuit board via the exposed portion 524-A of the upper dielectric substrate 510-A. In other examples, a speaker module can be utilized to hold down the flexible cable 500-B. In other examples, a conductive adhesive may be utilized to adhere the flexible cable 500-B to the printed circuit board. In other examples, any mechanical or electrical components can be incorporated directly into the flexible cable 500-B.

FIG. 5B illustrates that the lower dielectric substrate 510-B of the flexible cable 500-B is intact and spans the entire width of the flexible cable 500-B. In some examples, the material of the dielectric substrate fills the flexible cable 500-B.

FIG. 5B further illustrates a lower grounding plane 520-B, where the lower grounding plane 520-B is grounded together with the upper grounding plane 520-A with a grounding element 522. Additionally, the data signal transmission line 530 may be tied to a ground. In some examples, the data signal transmission line 530 is characterized as having a polygonal shape or a planar shape or a shape that corresponds to the shape of the dielectric substrate. In some examples, the data signal transmission line 530 is equidistant from the upper and lower grounding planes 520-A, B.

FIG. 5C further illustrates a cross-section of an embodiment of a flexible cable 500-C that is similar to the flexible cable 500-B except that a portion 524-B of the lower dielectric substrate 510-B is also removed so as to expose the lower grounding plane 520-B. In other words, the external surface of the lower grounding plane 520-B corresponds to a portion of an exterior surface of the flexible cable 500-C.

Figure 6A:
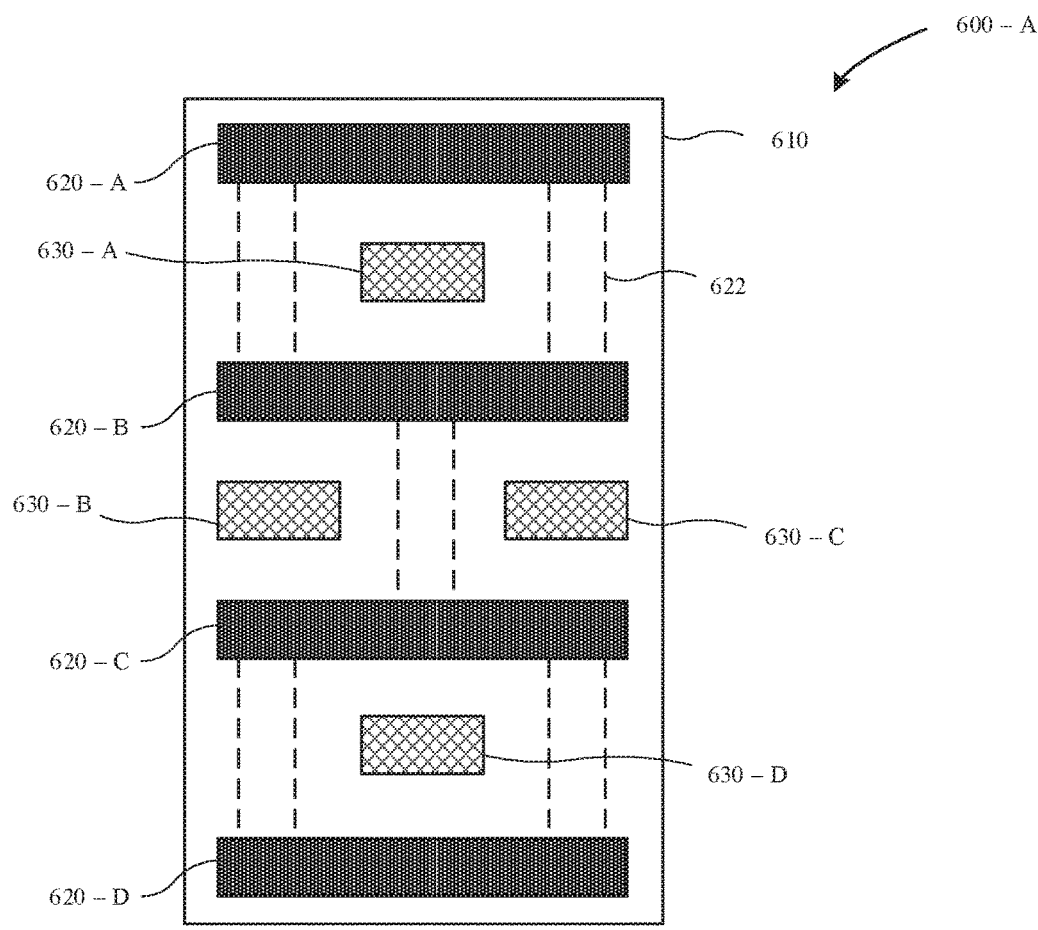
FIGS. 6A-6B illustrate various embodiments of a flexible cable for transmitting data signals between operational components, in accordance with some embodiments.
Figure 6B:
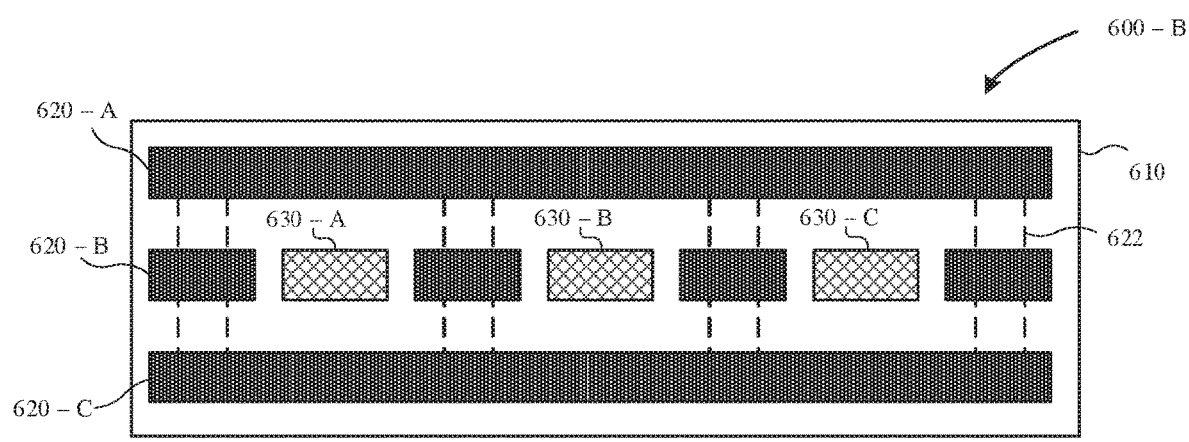

FIGS. 6A-6B illustrate cross-sectional views of various embodiments of a flexible cable—e.g., the flexible cable 600-A, B that is capable of transmitting data signals between operational components of a portable electronic device, in accordance with some embodiments. In some examples, the flexible cable corresponds to the flexible cable 230, as illustrated in FIG. 2.

FIG. 6A illustrates a cross-sectional view of a flexible cable 600-A, in accordance with some embodiments. Similar to the flexible cable 400-B of FIG. 4B, the flexible cable 600-A includes data signal transmission line that is separated by grounding planes. In contrast, FIG. 6A illustrates multiple data signal transmission lines. Indeed, the architecture of the flexible cable described herein is capable of incorporating any number of data signal transmission lines so long as the flexible cable fits within a cable pathway that electrically connects operational components of a portable electronic device. In particular, FIG. 6A illustrates the flexible cable 600-A includes a dielectric substrate 610 that carries within multiple grounding planes—e.g., 620-A, B, C, D and multiple data signal transmission lines 630-A, B, C, D. Of note, the multiple grounding planes 620 A, B, C, D are oriented generally parallel to each other and stacked in a generally vertical manner.

FIG. 6A illustrates that a first grounding plane 620-A and a second grounding plane 620-B separates a first data signal transmission line 630-A. Additionally, the second grounding plane 620-B and a third grounding plane 620-C separates a second data signal transmission line 630-B and a third data signal transmission line 630-C. Moreover, the third grounding plane 620-C and a fourth grounding plane 620-D separate a fourth data signal transmission line 630-D. FIG. 6A illustrates that each of the grounding planes 620-A, B, C, D are grounded together with grounding element(s) 622.

The dielectric substrate 610 of the flexible cable 600-A may be comprised of dielectric material that is capable of bending between tight junctions between operational components and/or support structures of the portable electronic device 100. In some examples, one or more of the grounding planes 620-A, B, C, D or the data signal transmission lines 630-A, B, C, D have a generally polygonal shape, planar shape, round shape or asymmetrical shape. In some examples, the dielectric substrate 610 may be characterized as having a generally polygonal shape, planar shape, round shape or asymmetrical shape. However, preferably, the dielectric substrate 610 may be of a planar shape so as to fit within tight junctions of a cable pathway—e.g. the cable pathway 210. In some examples, the thickness of the flexible cable 600-A, B is between about 0.10 mm to about 0.6 mm despite the multiple data signal transmission lines.

FIG. 6B illustrates a cross-sectional view of a flexible cable 600-B, in accordance with some embodiments. Similar to the flexible cable 600-A of FIG. 6A, the flexible cable 600-B includes multiple data signal transmission lines that are separated by multiple grounding planes. The architecture of the flexible cable described herein is capable of incorporating any number of data signal transmission lines so long as the flexible cable fits within a cable pathway that electrically connects operational components of a portable electronic device. Of note, the flexible cable 600-B includes data signal transmission lines 630-A, B, C that are oriented generally parallel and planar to each other. Additionally, the data signal transmission lines 630-A, B, C are generally parallel to an upper grounding plane 620-A and a lower grounding plane 620-B. Additionally, intermediary grounding planes 620-B are disposed between the upper and lower grounding planes 620-A, B. Additionally, the intermediary grounding planes 620-B also separate the data signal transmission lines 630-A, B, C from each other. The upper, intermediary, and lower grounding planes 620-A, B, C may be grounded together with grounding element(s) 622.

It should be noted that the various embodiments of the flexible cable as described with relation to FIG. 3, FIGS. 4A-4D, 5A-5C, and 6A-6B may incorporate any combination of architecture, number of layers (e.g., grounding plane, data signal transmission line, dielectric), materials, structural elements (e.g., moisture-resist, abrasion-resist, etc.), functional components (e.g., EMI shielding, grounding, signal conductivity, noise reduction, etc.) as sufficient to carry out the purpose of electrically connecting operational components via a cable pathway of a portable electronic device—e.g., the portable electronic device 100.

Figure 7:
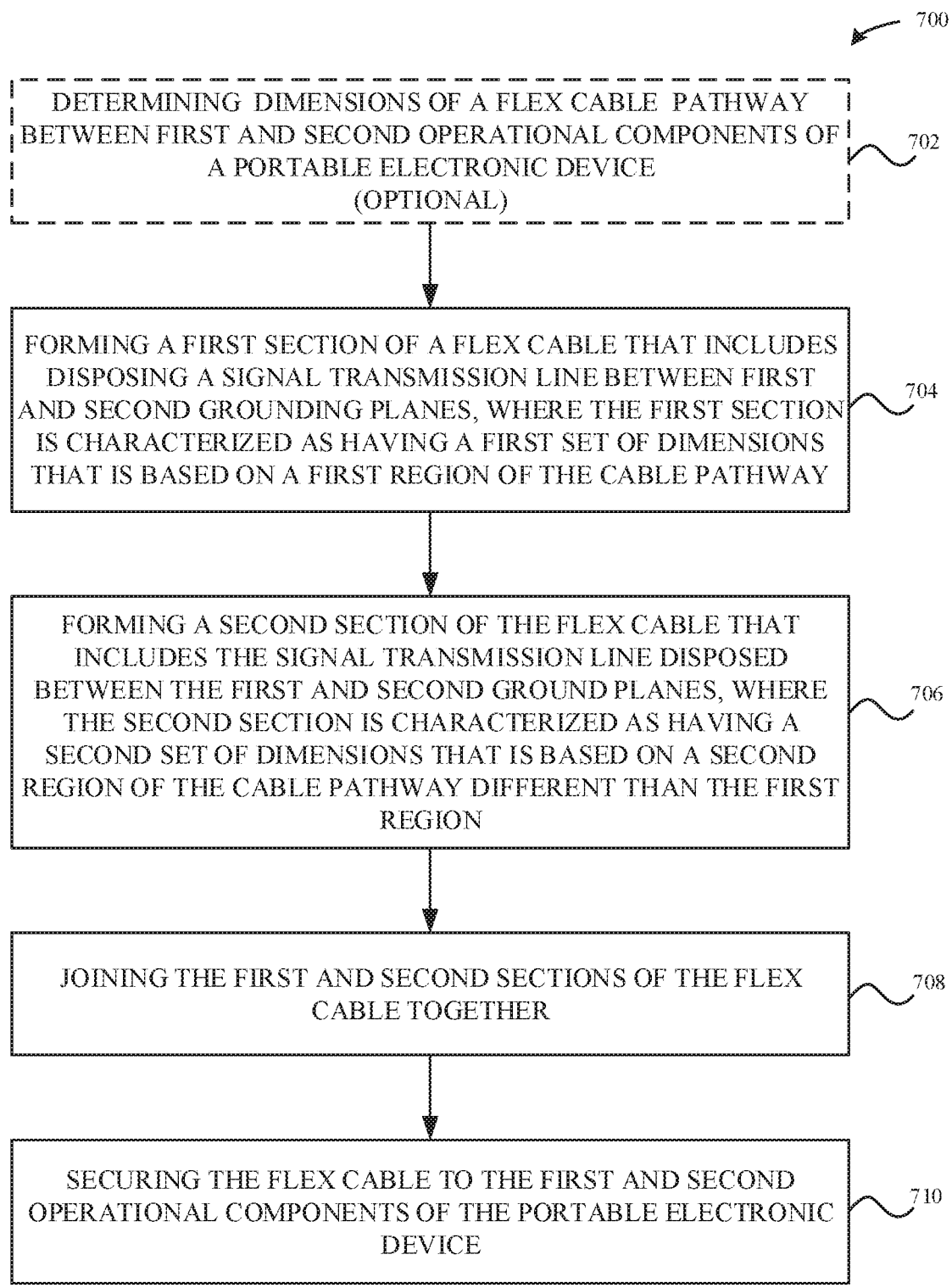
FIG. 7 illustrates a flowchart for electrically coupling operational components of a portable electronic device with a flexible cable, in accordance with some embodiments.

FIG. 7 illustrates a flow diagram of a method 700 for establishing an electrical connection between operational components of a portable electronic device, in accordance with some embodiments. As illustrated in FIG. 7, the method 700 optionally begins at step 702 that includes determining dimensions of a flexible cable pathway—e.g., the cable pathway 210—between at least first and second operational components of a portable electronic device—e.g., the portable electronic device 200. In some examples, the dimensions may include height, surface area, width, shape (e.g., linear, non-linear, irregular, etc.), surface texture of operational components and/or support structures, and the like. It should be noted that the method 700 may apply to any number of the various embodiments of the flexible cable described herein.

Step 704 includes forming a first section of the flexible cable—e.g., the flexible cable 400. In particular, the first section of the flexible cable 400 includes a signal transmission line e.g., the signal transmission line 430 that is disposed between first and second grounding planes e.g., the first and second grounding planes 420-A, B. In some embodiments, the first section of the flexible cable 400 has a first set of dimensions that is based on a first region of the cable pathway 210.

Step 706 includes forming a second section of the flexible cable 400. In particular, the second section of the flexible cable 400 includes the signal transmission line 430 that is disposed between the first and second grounding planes 420-A, B. In some embodiments, the second section of the flexible cable 400 has a second set of dimensions that is different than the first set of dimensions, and the second set of dimensions is based on a second region of the cable pathway 210.

Step 708 includes joining the first and second sections of the flexible cable 400 together. Although in other embodiments, the first and second sections of the flexible cable 400 may be integrally formed with each other (i.e., unibody construction).

Step 710 includes securing the flexible cable 400—that includes the first and second sections that are joined together—to the first and second operational components of the portable electronic device.

Figure 8:
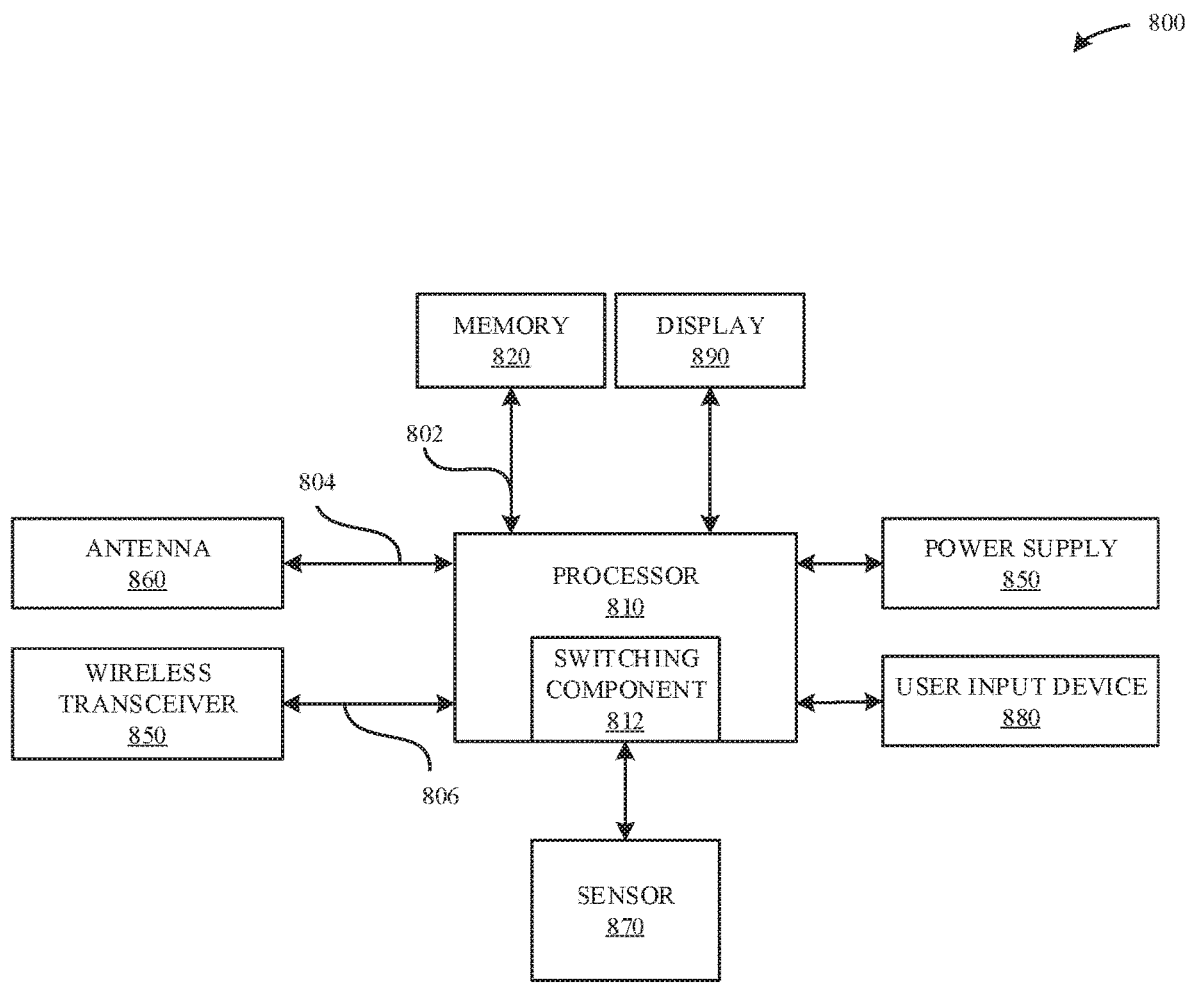
FIG. 8 illustrates a system diagram of a portable electronic device, in accordance with some embodiments.

FIG. 8 illustrates a system diagram of a portable electronic device 800 that is capable of implementing the various techniques described herein, according to some embodiments. In particular, the detailed view illustrates various components that can be included in the portable electronic device 100 as illustrated in FIG. 1.

As shown in FIG. 8, the portable electronic device 800 can include a processor 810 for controlling the overall operation of the portable electronic device 800. The processor 810 includes at least one switching component 812 for directing a pathway for multiple data signals via the flexible cable—e.g., the flexible cable 230. The portable electronic device 900 can include a display 890. The display 890 can be a touch screen panel that can include a sensor (e.g., capacitance sensor). The display 890 can be controlled by the processor 810 to display information to the user. A data bus 802 can facilitate data transfer between at least one memory 820 and the processor 810. The portable electronic device 800 can also include a network/bus interface 804 that couples a wireless antenna 860 to the processor 810 and a network/bus interface 806 that couples a wireless transceiver 850 to the processor 810. As described herein, the network/bus interfaces 804, 806 may correspond to the flexible cable as described herein. Additionally, the at least one switching component 812 is capable of switching signals between the wireless antenna 860 and the wireless transceiver 850.

The portable electronic device 800 can include a user input device 880, such as a switch. In some embodiments, the portable electronic device 800 includes a sensor 870, such as a barometric pressure sensor, capacitance sensor, and the like. The portable electronic device 800 includes a power supply unit, such as a lithium-ion battery.

The portable electronic device 800 also includes a memory 820, which can comprise a single disk or multiple disks (e.g., hard drives), and includes a storage management module that manages one or more partitions within the memory 820. In some embodiments, the memory 820 can include flash memory, semiconductor (solid state) memory or the like. The portable electronic device 800 can also include a Random Access Memory (RAM) and a Read-Only Memory (ROM). The ROM can store programs, utilities or processes to be executed in a non-volatile manner. The RAM can provide volatile data storage, and stores instructions related to the operation of the portable electronic device 800.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A flexible cable for a portable electronic device, the flexible cable comprising:
    a first signal transmission line configured to transmit a first data signal
    a second signal transmission line configured to transmit a second data signal different from the first data signal;
    a first grounding plane;
    a second grounding plane, wherein the first signal transmission line and the second signal transmission line are positioned between the first grounding plane and the second grounding plane; and
    an integrated switching component capable of switching between transmission of the first data signal or the second data signal.

2. The flexible cable of claim 1, wherein the first signal transmission line comprises a coaxial cable connection, and wherein the second signal transmission line comprises a flexible cable connection.

3. The flexible cable of claim 1, further comprising:
    a first dielectric substrate that encloses the first grounding plane; and
    a second dielectric substrate that encloses the second grounding plane.

4. The flexible cable of claim 3, wherein the first dielectric substrate and the second dielectric substrate define an outer perimeter, and wherein:
    at a first location, the outer perimeter comprises a first cross-sectional area, and
    at a second location, the outer perimeter comprises a second cross-sectional area that is less than the first cross-sectional area.

5. The flexible cable of claim 1, further comprising a grounding element connected to the first grounding plane and the second grounding plane, wherein the first grounding plane and the second grounding plane are grounded together based on the grounding element.

6. The flexible cable of claim 1, further comprising:
    a first end configured to electrically coupled to a circuit board; and
    a second end opposite the first end, wherein:
        the first signal transmission line comprises a coaxial cable connection,
        the second signal transmission line comprises a flexible cable connection, and
        the coaxial cable connection and the flexible cable connection are carried by the second end.

7. The flexible cable of claim 1, further comprising:
a first grounding element that defines an opening; and
a second grounding element that is positioned between the first grounding plane and the second grounding plane.

8. The flexible cable of claim 1, wherein at least one of the first grounding plane or the second grounding plane is directly exposed to a grounding contact of the portable electronic device.

9. A portable electronic device, comprising:
operational components that are separated by a pathway, wherein the operational components include connectors; and
a flexible cable positioned in the pathway and electrically coupled to the connectors, the flexible cable comprising:
 a first grounding plane and a second grounding plane, and
 a first signal transmission line and a second signal transmission line that are positioned between the first grounding plane and the second grounding plane, wherein the flexible cable includes (i) a first cross-sectional area corresponding to a first region of the pathway, and (ii) a second cross-sectional area corresponding to a second region of the pathway, wherein the second region is different than the first region.

10. The portable electronic device of claim 9, wherein the first signal transmission line transmits a first data signal, and wherein the second signal transmission line transmits a second data signal that is different from the first data signal.

11. The portable electronic device of claim 10, wherein the flexible cable further comprises an integrated switching component capable of switching between transmission of the first data signal or the second data signal.

12. The portable electronic device of claim 11, wherein the operational components comprise an antenna and a transceiver, and wherein:
the first signal transmission line comprises a coaxial cable connection connected to the antenna, and
the second signal transmission line comprises a flexible cable connection connected to the transceiver.

13. The portable electronic device of claim 12, further comprising:
a first dielectric substrate that encloses the first grounding plane; and
a second dielectric substrate that encloses the second grounding plane, wherein the first dielectric substrate and the second dielectric substrate define the first cross-sectional area and the second cross-sectional area.

14. The portable electronic device of claim 12, further comprising an enclosure that defines a cavity that carries the operational components and the flexible cable, wherein the operational components comprise a power supply unit and a logic board, the power supply and the logic board defining the pathway.

15. The portable electronic device of claim 14, wherein the flexible cable further comprises:
a first end configured to electrically coupled to the logic board; and
a second end opposite the first end, wherein the coaxial cable connection and the flexible cable connection are carried by the second end.

16. The portable electronic device of claim 9, further comprising a dielectric substrate that encloses the first grounding plane, wherein the dielectric substrate defines an exposed portion, and wherein the first grounding plane is in contact with a grounding contact at the exposed portion.

17. A portable electronic device, comprising:
an enclosure that defines a cavity, the enclosure carrying components, the components comprising:
 a flexible cable comprising a first end and a second end opposite the first end, the flexible cable comprising:
  a first signal transmission line configured to carry a first data signal, a second signal transmission line configured to carry a second data signal, wherein the first and second signal transmission lines are separated by a grounding plane;
 a logic board that is coupled to the flexible cable at the first end;
 an antenna coupled to a first terminal connection located at the second end, wherein the first data signal passes from the antenna through the first signal transmission line; and
 a wireless transceiver coupled to a second terminal connection located at the second end, wherein the second data signal passes from the wireless transceiver through the second signal transmission line.

18. The portable electronic device of claim 17, wherein the flexible cable further comprises an integrated switching component capable of switching between transmission of the first data signal or the second data signal.

19. The portable electronic device of claim 18, wherein the first terminal connection comprises a coaxial cable connection, and wherein the second terminal connection comprises a flexible cable connection, and wherein the integrated switching component capable of switching between the coaxial cable connection and the flexible cable connection.

20. The portable electronic device of claim 17, wherein the grounding plane defines a first grounding plane, and wherein the flexible cable further comprises:
a second grounding plane;
a third grounding plane, wherein the second grounding plane combines with the third grounding plane to surround the first signal transmission line and the second signal transmission line;
a first dielectric substrate that encloses the first grounding plane; and
a second dielectric substrate that encloses the second grounding plane.

* * * * *

UNITED STATES PATENT AND TRADEMARK OFFICE
CERTIFICATE OF CORRECTION

Page 1 of 2

PATENT NO. : 10,696,078 B2
APPLICATION NO. : 16/127071
DATED : June 30, 2020
INVENTOR(S) : Sloey et al.

It is certified that error appears in the above-identified patent and that said Letters Patent is hereby corrected as shown below:

In the Claims

In Claim 11, at Column 17, Lines 31-34:
"The portable electronic device of claim 10, wherein the flexible cable further comprises an integrated switching component capable of switching between transmission of the first data signal or the second data signal."

Should read:
-- The portable electronic device of claim 10, wherein the operational components comprise an antenna and a transceiver, and wherein:
    the first signal transmission line comprises a coaxial cable connection connected to the antenna, and
    the second signal transmission line comprises a flexible cable connection connected to the transceiver. --.

In Claim 12, at Column 17, Lines 35-41:
"The portable electronic device of claim 11, wherein the operational components comprise an antenna and a transceiver, and wherein:
    the first signal transmission line comprises a coaxial cable connection connected to the antenna, and
    the second signal transmission line comprises a flexible cable connection connected to the transceiver."

Should read:
-- The portable electronic device of claim 11, further comprising:
    a first dielectric substrate that encloses the first grounding plane; and
    a second dielectric substrate that encloses the second grounding plane, wherein the first dielectric substrate and the second dielectric substrate define the first cross-sectional area and the second cross-sectional area. --.

Signed and Sealed this
Tenth Day of November, 2020

Andrei Iancu
*Director of the United States Patent and Trademark Office*

In Claim 13, at Column 17, Lines 42-50:
"The portable electronic device of claim 12, further comprising:
   a first dielectric substrate that encloses the first grounding plane; and
   a second dielectric substrate that encloses the second grounding plane, wherein the first dielectric substrate and the second dielectric substrate define the first cross-sectional area and the second cross-sectional area."

Should read:
-- The portable electronic device of claim 11, further comprising an enclosure that defines a cavity that carries the operational components and the flexible cable, wherein the operational components comprise a power supply unit and a logic board, the power supply and the logic board defining the pathway. --.

In Claim 14, at Column 17, Lines 51-56:
"The portable electronic device of claim 12, further comprising an enclosure that defines a cavity that carries the operational components and the flexible cable, wherein the operational components comprise a power supply unit and a logic board, the power supply and the logic board defining the pathway."

Should read:
-- The portable electronic device of claim 13, wherein the flexible cable further comprises:
   a first end configured to electrically coupled to the logic board; and
   a second end opposite the first end, wherein the coaxial cable connection and the flexible cable connection are carried by the second end. --.

In Claim 15, at Column 18, Lines 1-7:
"The portable electronic device of claim 14, wherein the flexible cable further comprises:
   a first end configured to electrically coupled to the logic board; and
   a second end opposite the first end, wherein the coaxial cable connection and the flexible cable connection are carried by the second end."

Should read:
-- The portable electronic device of claim 10, wherein the flexible cable further comprises an integrated switching component capable of switching between transmission of the first data signal or the second data signal. --.